(12) United States Patent
Park

(10) Patent No.: US 6,771,550 B2
(45) Date of Patent: Aug. 3, 2004

(54) SEMICONDUCTOR MEMORY DEVICE WITH STABLE PRECHARGE VOLTAGE LEVEL OF DATA LINES

(75) Inventor: San-Ha Park, Ichon (KR)

(73) Assignee: Hynix Semiconductor Inc., Ichon (KR)

( * ) Notice: Subject to any disclaimer, the term of this patent is extended or adjusted under 35 U.S.C. 154(b) by 1 day.

(21) Appl. No.: 10/252,530

(22) Filed: Sep. 24, 2002

(65) Prior Publication Data

US 2003/0058720 A1 Mar. 27, 2003

(30) Foreign Application Priority Data

Sep. 24, 2001 (KR) ........................................ 2001-58975

(51) Int. Cl.$^7$ ................................................. G11C 7/00
(52) U.S. Cl. .................. 365/203; 365/204; 365/230.06
(58) Field of Search ................................. 365/203, 204, 365/230.06, 205, 207, 189.11

(56) References Cited

U.S. PATENT DOCUMENTS

| | | |
|---|---|---|
| 4,984,202 A | 1/1991 | Kawahara et al. |
| 5,301,160 A | 4/1994 | McAdams |
| 5,402,379 A | 3/1995 | McClure |
| 5,555,215 A | 9/1996 | Nakagome et al. |
| 5,689,469 A * | 11/1997 | Asaka et al. ................. 365/203 |
| 5,859,791 A | 1/1999 | Schultz et al. |
| 5,880,990 A | 3/1999 | Miura |
| 5,892,722 A | 4/1999 | Jang et al. |
| 5,910,911 A | 6/1999 | Sekiguchi et al. |
| 5,995,443 A | 11/1999 | Farmwald et al. |
| 6,160,733 A | 12/2000 | Ebel |

* cited by examiner

Primary Examiner—David Lam
(74) Attorney, Agent, or Firm—Jacobson Holman PLLC

(57) ABSTRACT

An equalizing and precharging circuit in a semiconductor memory device includes a pull down equalizing and precharging unit for equalizing and precharging data lines in response to an input/output equalizing signal and a pull up equalizing and precharging unit for equalizing and precharging data lines in response to an input/output equalizing bar signal.

12 Claims, 8 Drawing Sheets

SEMICONDUCTOR MEMORY DEVICE WITH STABLE PRECHARGE VOLTAGE LEVEL OF DATA LINES

FIELD OF THE INVENTION

The present invention relates to a semiconductor memory device; and, more particularly, to a semiconductor memory device having improved peripheral circuits with a stable precharge voltage level of data lines.

DESCRIPTION OF THE PRIOR ART

Generally, since an operation delay is caused in a semiconductor memory device using a low precharge voltage level, a power supply voltage $V_{DD}$ (or peripheral voltage) is used as a precharge voltage to improve a sensing speed of data lines. However, when $V_{DD}$ is used as the precharge voltage, a voltage level of the data lines becomes a ground voltage ($V_{SS}$) level in a write operation and, thereafter, the voltage level becomes the $V_{DD}$ level at a precharge operation. Therefore, current consumption highly increases in a burst write operation. Specially, the current consumption highly increases in a high density memory device having a high parasitic capacitance of data lines and in a double data rate (DDR) memory device having a plurality of data lines.

A semiconductor memory device comprises peripheral circuits including I/O sense amplifiers, equalizers and write drivers and a core having memory cells. Since a noise is generated by a lot of I/O data from and to a write buffer, different voltage levels are applied to the peripheral circuit and the core in order to avoid the noise.

Also, when a read operation is carried out in a low voltage level, a characteristic of switch performance between data lines are deteriorated, so that a desired data signal cannot be obtained. Accordingly, a stable operation of the I/O sense amplifier cannot be expected.

In order to solve the above problems, a precharge circuit for precharging the data lines with a half core voltage $V_{BLP}$ ($V_{core}/2$) level or a half power supply voltage level ($V_{DD}/2$) is, recently, used for speedy write and read operations.

FIG. 1 is a schematic block diagram illustrating a typical semiconductor memory device.

The semiconductor memory device includes a plurality of local data line sense amplifiers 110, a plurality of pairs of local data lines 160A and 160B, a plurality of pairs of global data lines 170A and 170B, a switch unit 120, an I/O sense amplifier (IOSA) 130, an equalizing and precharging unit 150 and a write driver 140.

The local data line sense amplifier 110 amplifies data on the local data lines 160A and 160B. The switch unit 120 controls a transfer of the amplified data from the local data lines 160A and 160B to the global data lines 170A and 170B. The I/O sense amplifier IOSA 130, which is connected to the global data lines 170A and 170B, amplifies data read out from a memory cell (not shown) in order to output the data to an external circuit of the semiconductor memory device.

The equalizing and precharging unit 150 equalizes and precharges the global data lines 170A and 170B by supplying half core voltage $V_{BLP}$ to the global data lines 170A and 170B. The write driver 140, which is connected to the global data lines 170A and 170B, is used to write data to the memory cell.

FIG. 2A is a circuit diagram illustrating an exemplary equalizing and precharging unit 150 using only NMOS transistors for precharging the global data lines 170A and 170B according to the prior art.

The equalizing and precharging unit 150 includes a first NMOS transistor NT1 and a second transistor NT2 connected to the global data lines 170A and 170B in series for precharging the global data lines 170A and 170B with a half core voltage $V_{BLP}$ applied between the first NMOS transistor NT1 and the second MOS transistor NT2 and a third NMOS transistor NT3 for equalizing in response to an I/O equalizing signal IOEQ. The I/O equalizing signal is applied to each gate of the NMOS transistors NT1, NT2 and NT3. When the I/O equalizing signal IOEO is enabled with a power supply voltage VDD for the precharge operation, the NMOS transistors NT1 and NT3 are turned on and then, the NMOS transistor NT2 is turned on later than the NMOS transistors NT1 and NT3. Namely, after the burst write operation is completed, when the precharge operation is carried out again, the precharge voltage level of the global data lines 170A and 170B becomes a little bit lower than a previous precharge voltage level because the NMOS transistors NT1 and NT3 are turned on earlier than the NMOS transistor NT2.

Therefore, when the burst write operation is repeatedly carried out, the precharge voltage level of the global data lines 170A and 170B gradually is fallen toward ground voltage vss level.

FIG. 2B is a waveform illustrating a simulation result of the precharge operation of the equalizing and precharging unit 150 of FIG. 2A.

Referring to FIG. 2B, as the burst write operation is repeatedly carried out from WRITE1 to WRITE4, the precharge voltage level is decreased bit by bit toward the ground voltage $V_{SS}$ level.

FIG. 3A is a circuit diagram illustrating another exemplary equalizing and precharging unit 150 using only PMOS transistors for precharging the global data lines 170A and 170B according to the prior art.

The equalizing and precharging unit 150 includes a first PMOS transistor PT1 and a second transistor PT2 for precharging the global data lines 170A and 170B with $V_{BLP}$ and a third PMOS transistor PT3 for an equalizing operation in response to an I/O equalizing bar signal IOEQZ. The I/O equalizing bar signal IOEQZ is applied to each gate of the PMOS transistors PT1, PT2 and PT3. When the I/O equalizing signal bar IOEQZ is enabled with 0 V for the precharge operation, the PMOS transistors PT2 and PT3 are turned on and then, the PMOS transistor PT1 is turned on later than the PMOS transistors PT2 and PT3 Therefore, when the write burst operation is repeatedly carried out, the precharge voltage level of the global data lines 170A and 170B gradually increases toward core voltage $V_{core}$.

FIG. 3B is a waveform illustrating a simulation result of the precharge operation of the equalizing and precharging unit 150 in FIG. 3A.

Referring to FIG. 3B, as the burst write operation is repeatedly carried out from WRITE1 to WRITE4, the precharge voltage level is increased bit by bit toward the core voltage $V_{core}$ level.

As mentioned above, when precharging the data lines by using the conventional method, a precharge voltage level is not maintained in a half core voltage $V_{BLP}$ as the burst write operation is repeatedly carried out. Accordingly, there are problems that current consumption is increased and an operation speed becomes slow.

SUMMARY OF THE INVENTION

It is, therefore, an object of the present invention to provide a semiconductor memory device reducing current consumption in read/write and precharging operations.

In accordance with an aspect of the present invention, there is provided an equalizing and precharging circuit in a semiconductor memory device, comprising: a pull down equalizing and precharging unit for equalizing and precharging data lines in response to an input/output equalizing signal; and a pull up equalizing and precharging unit for equalizing and precharging data lines in response to an input/output equalizing bar signal.

In accordance with another aspect of the present invention, there is provided a semiconductor memory device, comprising: a local data line sense amplifier for amplifying data, which are on local data lines; a first switching means for controlling data transfer from the local data lines into global data lines; an input/output sense amplifier, which is connected to the global data lines for amplifying and outputting data read out from a memory cell to an external circuit of the semiconductor device; an equalizing and precharging means, which is connected to the global data lines, for equalizing and precharging the global data lines, wherein the equalizing and precharging means includes a first equalizing and precharging unit and a second equalizing and precharging unit for quickly equalizing and precharging the global data lines; and a write driver, which is connected to the global data lines, for writing data to the memory cell.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Hereinafter, a semiconductor memory device having an improved precharge circuit in accordance with the present invention will be described in detail referring to the accompanying drawings.

Figure 1:
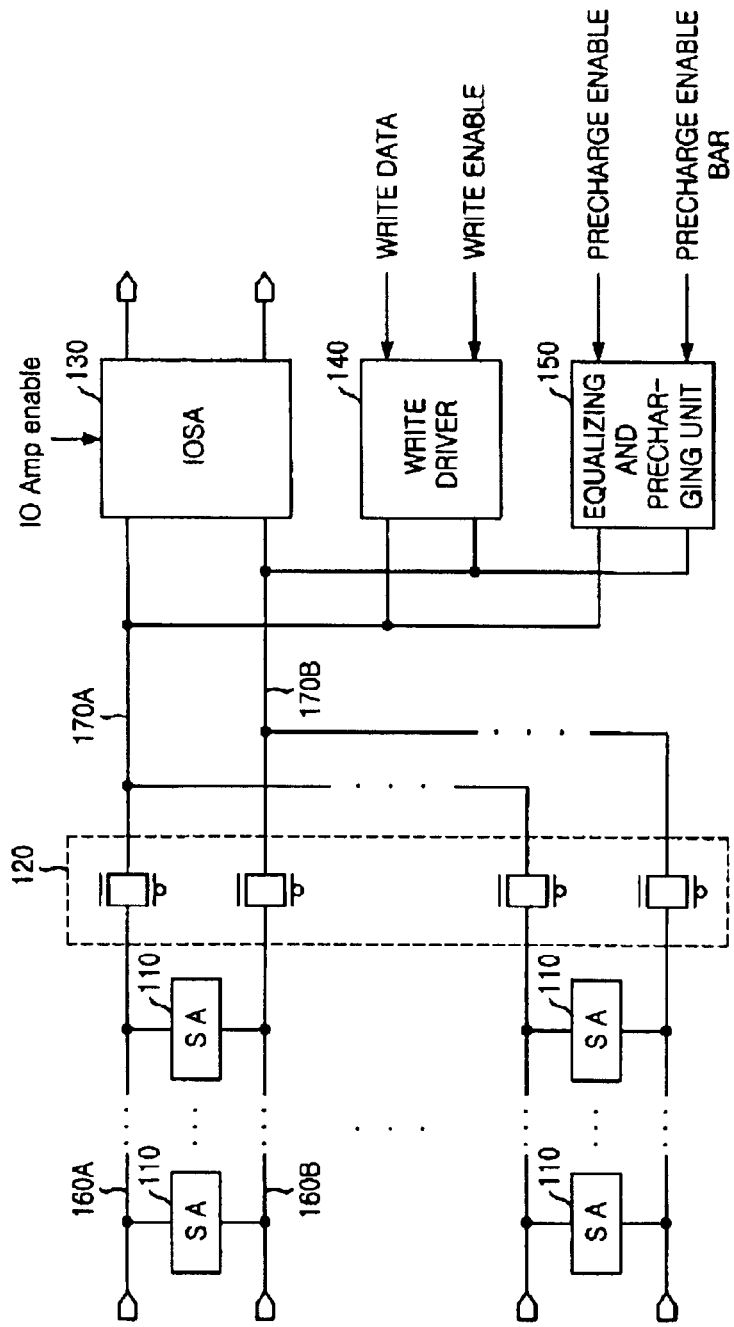
FIG. 1 is a schematic block diagram showing a semiconductor memory device according to the prior art.
Figure 2A:
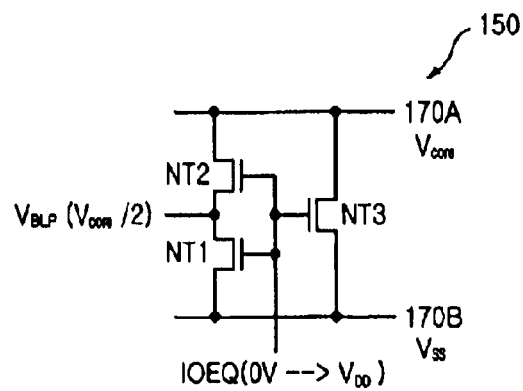
FIG. 2A is a circuit diagram illustrating an exemplary equalizing and precharging unit 150 in FIG. 1.
Figure 2B:
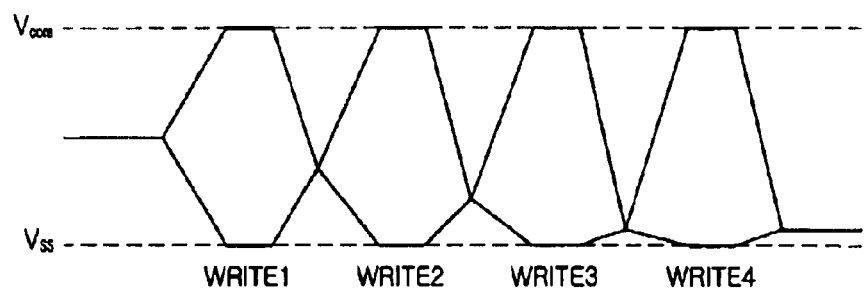
FIG. 2B is a waveform illustrating a simulation result of the equalizing and precharging unit 150 of FIG. 2A.
Figure 3A:
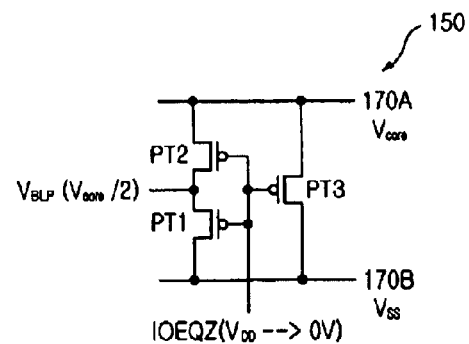
FIG. 3A is a circuit diagram illustrating another exemplary equalizing and precharging unit 150 in FIG. 1.
Figure 3B:
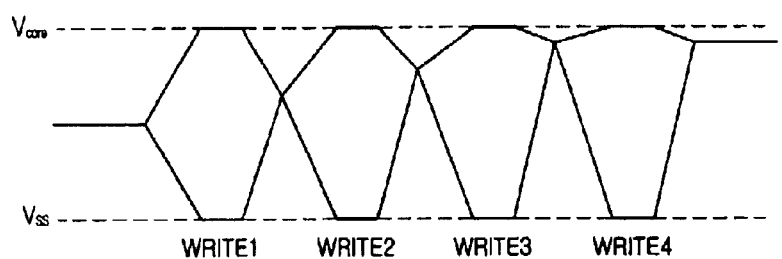
FIG. 3B is a waveform illustrating a simulation result of the equalizing and precharging unit 150 of FIG. 3A.
Figure 4A:
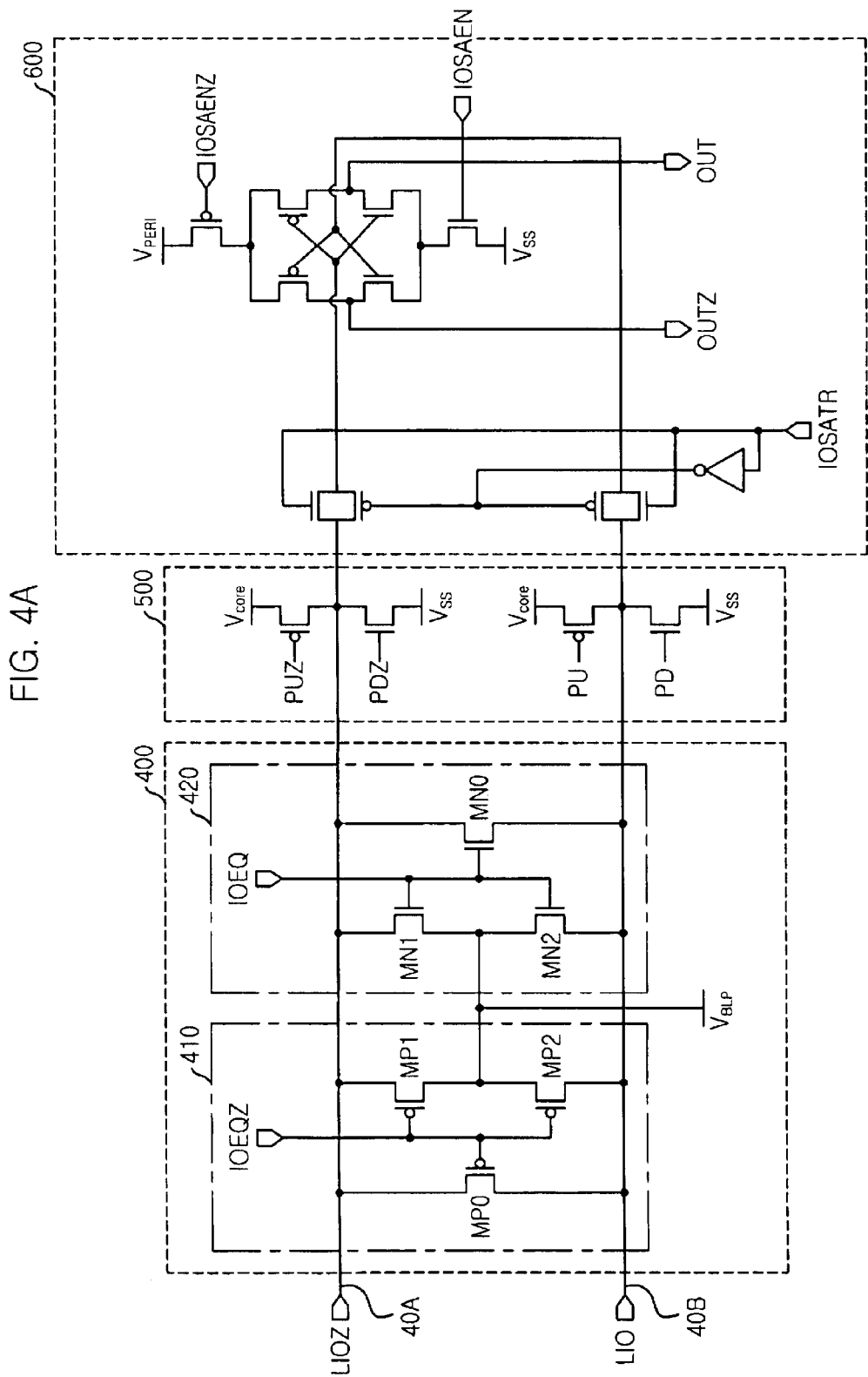
FIG. 4A is a circuit diagram illustrating a peripheral circuit of a semiconductor memory device in accordance with the present invention.

FIG. 4A is a circuit diagram illustrating a semiconductor memory device including an I/O sense amplifier IOSA 600, a write driver 500 and an equalizing and precharging unit 400 in accordance with the present invention. Furthermore, the semiconductor memory device further includes global data lines 40A and 40B, which are connected to local data lines through a switch unit identical to the conventional semiconductor memory device as shown in FIG. 1. Also, the local data lines are connected to a memory core including memory cells.

Referring to FIG. 4A, the I/O sense amplifier IOSA 600, the equalizing and precharging unit 400 and the write driver are connected to the global data lines 40A and 40B. The equalizing and precharging unit 400 includes a pull up precharging unit 410 and a pull down precharging unit 420. The pull up precharging unit 410 has a first PMOS transistor MP0, a second PMOS transistor MP1 and a third PMOS transistor MP2. The first PMOS transistor MP0 is for equalizing and the second and third PMOS transistors MP1 and MP2 are for precharging the global data lines 40A and 40B. The PMOS transistors MP1 and MP2 are connected to the global data lines 40A and 40B in series and a half core voltage $V_{BLP}$ is applied to a center of the PMOS transistors MP1 and MP2.

Also, the pull down precharging unit 420 has a first NMOS transistor MN0, a second NMOS transistor MN1 and a third NMOS transistor MN2. The first NMOS transistor MN0 is for equalizing and the second and third NMOS transistors MN1 and MN2 are for precharging the global data lines 40A and 40B.

In order to precharge the global data lines 40A and 40B, the half core voltage $V_{BLP}$ or the half supply voltage $V_{DD}$ is applied as a precharge voltage in accordance with the present invention. The global data lines 40A and 40B are precharged with $V_{BLP}$ and then, when data are written in a memory cell (not shown), pull down transistors or pull up transistors, which are on the write driver 500, are driven in response to a combination signal of a write enable signal and a write data signal, so that a voltage level of one data line in the global data lines 40A and 40B becomes from $V_{BLP}$ to a ground voltage $V_{SS}$ and a voltage level of the other data line becomes $V_{core}$. In order to precharge the global data lines 40A and 40B again, the global data lines 40A and 40B are shorted through equalizing transistors MN0 and MP0 in the equalizing and precharging unit 400, so that the global data lines 40A and 40B are precharged with $V_{BLP}$.

The transistors MN0, MN1, MN2, MP0, MP1 and MP2 are driven in response to I/O equalizing enable signals IOEQ and IOEQZ. Namely, the precharge operation of the global data lines 40A and 40B is carried out by a charge sharing operation of the precharge transistors MN1, MN2, MP1 and MP2.

Also, since the pull up precharging unit 410 and the pull down precharging unit 420 are employed to precharge the global data lines in accordance with the present invention, after the write operation is completed, the global data lines is accurately precharged with $V_{BLP}$ again. Namely, as the write operation is repeatedly carried out, the precharge voltage level of the global data lines is maintained in the $V_{BLP}$ level. Accordingly, when a burst write operation is carried out, write/precharge currents are reduced.

Furthermore, as $V_{BLP}$ is used to precharge the global data lines 40A and 40B, a power noise due to a peak current generated in an operation of the write driver 500 and the precharge operation is reduced.

A read operation is similar to the conventional read operation. However, the differences are that the global data lines 40A and 40B is precharged with a half core voltage $V_{BLP}$ level and an I/O sense amplifier 600 of a cross-couple type is used to prevent a access time delay generated by using half core voltage $V_{BLP}$ as precharge voltage.

As the present invention uses the sense amplifier of a cross-couple type, which is generally used as a bitline sense amplifier using half core voltage, as the I/O sense amplifier (IOSA) 600, a read access time delay, which can be generated by reducing the precharge voltage level in the equalizing and precharging unit 400, is removed and an operation current is, also, decreased.

Figure 4B:
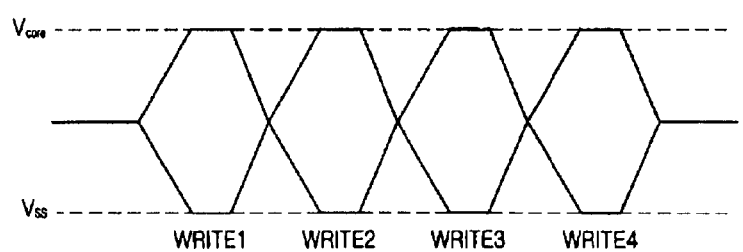
FIG. 4B is a waveform illustrating a simulation result of the equalizing and precharging unit 400 in FIG. 4A.

FIG. 4B is a waveform illustrating a simulation result of the equalizing and precharging unit 400 in FIG. 4A.

Referring to FIG. 4B, even if the write operation is repeatedly carried out in many times, the precharge voltage level of the global data lines is maintained in $V_{BLP}$.

Figure 5:
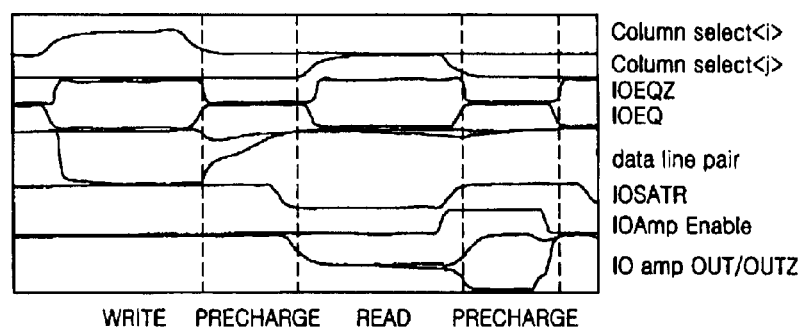
FIG. 5 is a timing diagram showing read/write operations and precharging operation in accordance with the present invention.

FIG. 5 is a timing diagram showing read, write and precharge operations in accordance with the present invention.

When a read command is inputted, corresponding data designated by inputting an address signal are transferred to a local data lines and the global data lines. At this time, the voltage level of the data line starts from half core voltage $V_{BLP}$. After a predetermined time delay to obtain a desired signal, the I/O output sense amplifier 600 driven by an I/O sense amplifier enable signals IOSAENZ and IOSAEN transfers the data into a write buffer (not shown). After the read operation, a precharge operation is repeatedly carried out after the write operation is completed. In a burst read/write operation, a read-precharge operations or a write-precharge operation is repeatedly carried out identical to the operations of the conventional circuit.

FIGS. 6(A) to 6(D) are graphs showing comparison of a peak current consumption and an effective current consumption between the present invention and the prior art.

Figure 6A:
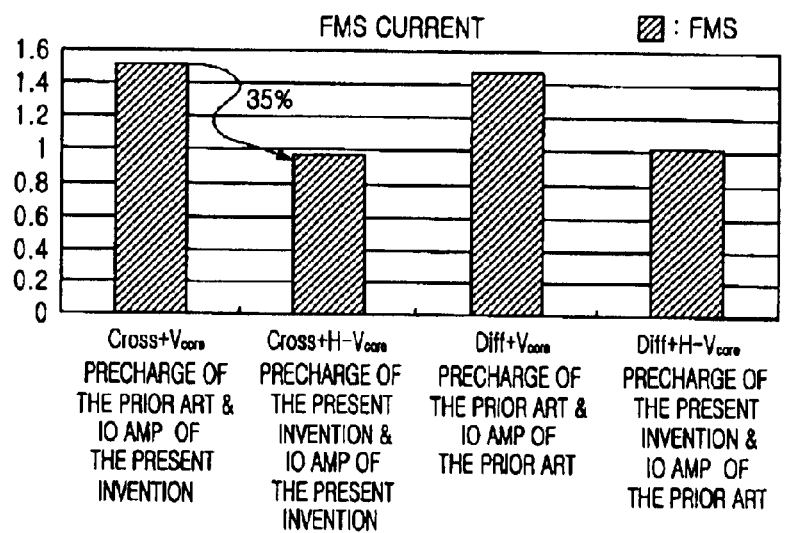
FIGS. 6A to 6D are graphs showing comparison of a peak current consumption and an effective current consumption between the prior art and the present invention.
Figure 6B:
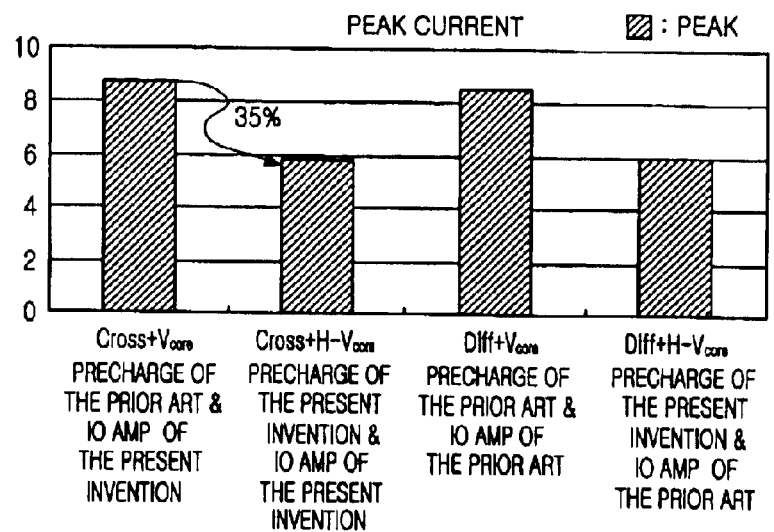

FIG. 6(A) is a graph showing an effective current consumed in the write and precharge operations and FIG. 6(B) is a graph showing a peak current consumed in the write and precharge operations. When the precharging unit and the input/output sense amplifier are used in accordance with the present invention, the peak current and the effective current consumptions decrease about 35%, respectively.

Figure 6C:
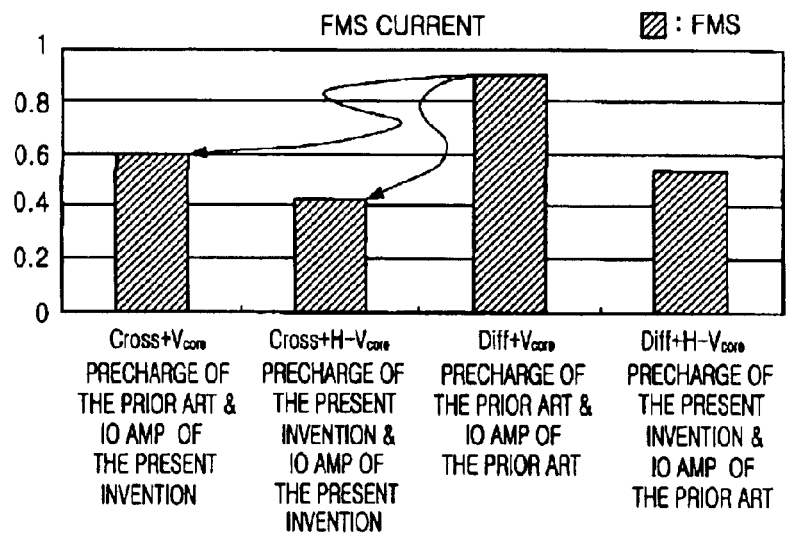
Figure 6D:
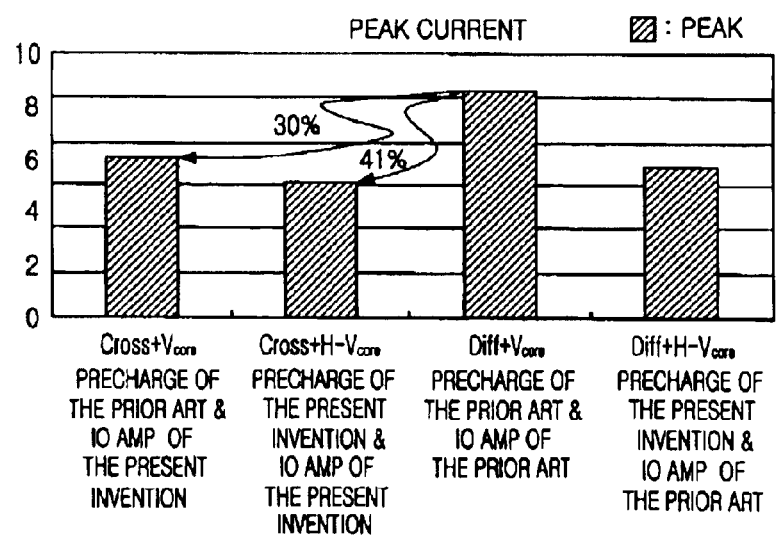

FIG. 6(C) is a graph showing an effective current consumed in the read and precharge operations and FIG. 6(D) is a graph showing a peak current consumed in the read and precharge operations. When the precharging unit and the input/output sense amplifier are used in accordance with the present invention, the effective current consumption decreases about 54% and the peak current consumption decreases about 41% compared with the prior art.

Accordingly, a voltage level of the data lines is changed from a half core voltage $V_{BLP}$ level to a ground voltage $V_{SS}$ level or a core voltage Vcore level in the write operation and the global data lines are shorted through the equalizing and precharging transistor in the precharge operation, so that the global data lines are precharged to a half core voltage $V_{BLP}$ level again. Namely, the precharge operation of the global data lines is carried out by charge sharing each other instead of using a precharge current so that a write/precharge current consumption decreases about 60% in a burst write operation.

Also, a power noise generated due to a peak current generated in a write driver operation or a precharge operation, a stable operation of the semiconductor device is expected. As the input/output sense amplifier of a cross couple type, which is similar to a bitline sense amplifier, is used, a delay of an access speed due to using a half core voltage $V_{BLP}$ level or a half $V_{DD}$ in the read operation is prevented and an operation current can be reduced compared with a conventional differential amplifier. In addition, a delay of an access time due to using half core voltage $V_{BLP}$ can be prevented.

A signal reduction of the global data line generated in an operation of a memory device using a low power supply voltage level is improved by using the half $V_{core}$ or half $V_{DD}$ precharging technology.

When the bitline, the local data line and the global data line are standby, they are recharged to the same voltage level so that a standby current is reduced.

While the present invention has been described with respect to the particular embodiments, it will be apparent to those skilled in the art that various changes and modifications may be made without departing from the spirit and scope of the invention as defined in the following claims.

What is claimed is:

1. An equalizing and precharging circuit in a semiconductor memory device, comprising:
   a pull down equalizing and precharging unit for equalizing and precharging data lines in response to an input/output equalizing signal; and
   a pull up equalizing and precharging unit for equalizing and precharging data lines in response to an input/output equalizing bar signal.

2. The equalizing and precharging circuit as recited in claim 1, wherein the data lines are precharged to half core voltage or half power supply voltage.

3. The equalizing and precharging circuit as recited in claim 1, wherein the pull down equalizing and precharging unit includes:
   a first and a second NMOS transistors, which are connected to the data lines in series, for precharging the data lines in response to the input/output equalizing signal; and
   a third NMOS transistor, which is connected to the data lines, for equalizing the data lines in response to the input/output equalizing signal.

4. The equalizing and precharging circuit as recited in claim 1, wherein the pull up equalizing and precharging unit includes:
   a first and a second PMOS transistors, which are connected to the data lines in series, for precharging the data lines in response to the input/output equalizing bar signal; and
   a third PMOS transistor, which is connected to the data lines, for equalizing the data lines in response to the input/output equalizing bar signal.

5. A semiconductor memory device, comprising:
   a local data line sense amplifier for amplifying data, which are on local data lines;
   a first switching means for controlling data transfer from the local data lines into global data lines;
   an input/output sense amplifier, which is connected to the global data lines for amplifying and outputting data read out from a memory cell to an external circuit of the semiconductor device;
   an equalizing and precharging means, which is connected to the global data lines, for equalizing and precharging the global data lines, wherein the equalizing and precharging means includes a first equalizing and precharging unit and a second equalizing and precharging unit for quickly equalizing and precharging the global data lines; and
   a write driver, which is connected to the global data lines, for writing data to the memory cell.

6. The semiconductor memory device as recited in claim 5, wherein the data lines are precharged to half core voltage or half power supply voltage.

7. The semiconductor memory device as recited in claim 6, the first equalizing and precharging unit includes:
  a PMOS transistor, which is connected to the global data lines, driven by an input/output equalizing bar signal; and
  a plurality of PMOS transistors, which are connected to the global data lines in series, driven by the input/output equalizing bar signal, wherein half core voltage or half supply voltage is applied to a center of the plurality of the PMOS transistors.

8. The semiconductor memory device as recited in claim 6, wherein the second equalizing and precharging unit includes:
  a NMOS transistor, which is connected to the global data lines, driven an input/output equalizing signal (IOEQZ); and
  a plurality of NMOS transistors which are connected to the global data lines in series driven by the input/output equalizing signal (IOEQ), wherein half core voltage or half supply voltage is applied to a center of the plurality of the NMOS transistors.

9. The semiconductor memory device as recited in claim 5, wherein the write driver includes:
  a plurality of PMOS transistors, which power supply voltage is applied to drains and sources thereof, connected to the global data lines, wherein a pull up signal is applied to a gate of the PMOS transistor, which is connected to the global data line bar and a pull up bar signal is applied to a gate of the PMOS transistor, which is connected to the global data line; and
  a plurality of NMOS transistors, which drains are connected to the global data lines and ground voltage is applied to sources, wherein a pull down signal is applied to a gate of the NMOS transistor, which is connected to the global data line and a pull down bar signal is applied to a gate of the NMOS transistor, which is connected to the global data line.

10. The semiconductor memory device as recited in claim 9, wherein the second switching means is a transfer transistor, which an input/output sense amplifier enable signal is applied to its gate.

11. The semiconductor memory device as recited in claim 5, wherein the input/output sense amplifier is an amplifier of a cross couple type.

12. The semiconductor memory device as recited in claim 11, wherein the input/output sense amplifier includes a second switching means for controlling that data inputted to the global data lines are outputted to an external circuit of the semiconductor memory device.

* * * * *